United States Patent
Nakamura

[11] Patent Number: 6,020,596
[45] Date of Patent: *Feb. 1, 2000

[54] SUPERCONDUCTING DEVICE INCLUDING AN ISOLATION LAYER

[75] Inventor: Takao Nakamura, Osaka, Japan

[73] Assignee: Sumitomo Electric Industries, Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/723,150

[22] Filed: Sep. 30, 1996

[30] Foreign Application Priority Data

Sep. 29, 1995 [JP] Japan .................................. 7-277114

[51] Int. Cl.$^7$ .......................... H01L 29/06; H01B 12/00; B32B 12/00
[52] U.S. Cl. .............................. 257/39; 257/38; 505/193; 505/237
[58] Field of Search .......................... 257/38, 39, 35–37; 505/193, 237

[56] References Cited

U.S. PATENT DOCUMENTS

| | | | |
|---|---|---|---|
| 5,324,714 | 6/1994 | Inam et al. | 505/237 |
| 5,447,907 | 9/1995 | Nakamura et al. | 505/193 |
| 5,510,324 | 4/1996 | Nakamura et al. | 505/193 |
| 5,571,777 | 11/1996 | Tanaka et al. | 505/237 |
| 5,594,257 | 1/1997 | Nakamura et al. | 257/38 |

FOREIGN PATENT DOCUMENTS

| | | |
|---|---|---|
| 0 508 844 | 10/1992 | European Pat. Off. . |
| 0 576 363 | 12/1993 | European Pat. Off. . |
| 2-17684 | 1/1990 | Japan .................................. 257/36 |

OTHER PUBLICATIONS

Fork et al., "Reaction Patterning of YBa$_2$Cu$_3$O$_{7-\delta}$ Thin Films on Si", Applied Physics Letter No. 57 (23), (1990), pp. 2504–2506.

Hatano et al., "Unique Method of Patterning Superconducting Thin Films by Selective Growth of YOBa–Cu–O", Japanese Journal of Applied Physics, vol. 29, No. 6, (1990), pp. 1076–1079.

Fujii et al., "Metal–Insulator–Superconductor Field–Effect–Transistor Using SrTIO$_3$/YBa$_2$Cu$_3$O$\gamma$ Heteroepitaxial Films", Japanese Journal of Applied Physics, vol. 31, No. 5B, May 1992, pp. L612–L615.

*Primary Examiner*—Mahshid Saadat
*Assistant Examiner*—Allan R. Wilson
*Attorney, Agent, or Firm*—Foley & Lardner

[57] ABSTRACT

A FET type superconducting device comprises a substrate having a principal surface, a thin superconducting channel formed of an oxide superconductor layer over the principal surface of the substrate, a superconducting source region and a superconducting drain region formed of an oxide superconductor layer over the principal surface of the substrate at the both ends of the superconducting channel which connects the superconducting source region and the superconducting drain region, so that superconducting current can flow through the superconducting channel between the superconducting source region and the superconducting drain region and a gate electrode on a gate insulator disposed on the superconducting channel for controlling the superconducting current flowing through the superconducting channel by a signal voltage applied to the gate electrode, wherein the superconducting device is isolated by a isolation layer directly formed on the principal surface of the substrate, the superconducting layer of the superconducting channel is directly formed on the principal surface of the substrate and the gate electrode is formed on the isolation layer excluding a portion on the gate insulator.

9 Claims, 6 Drawing Sheets

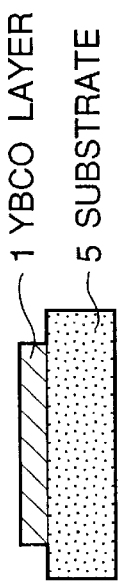
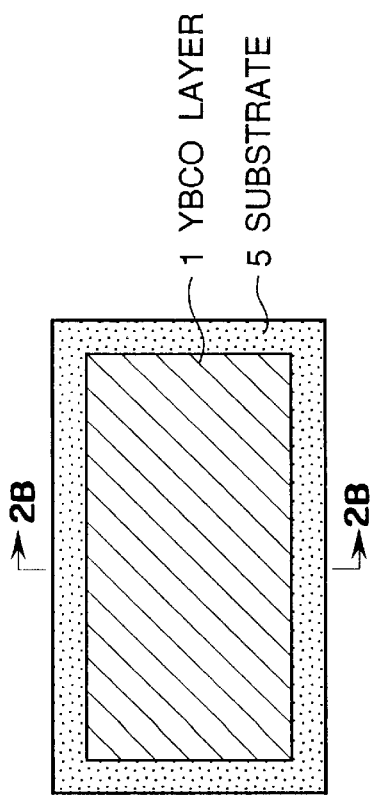
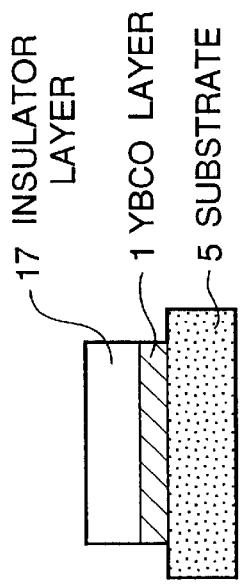
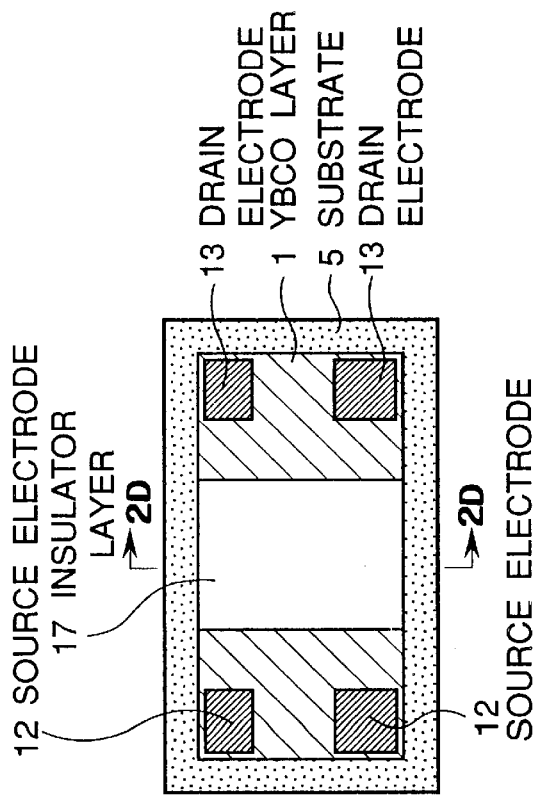

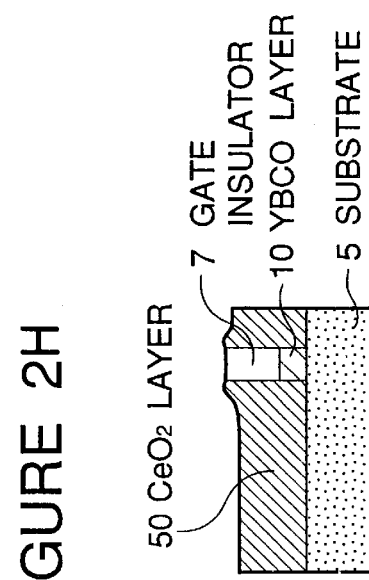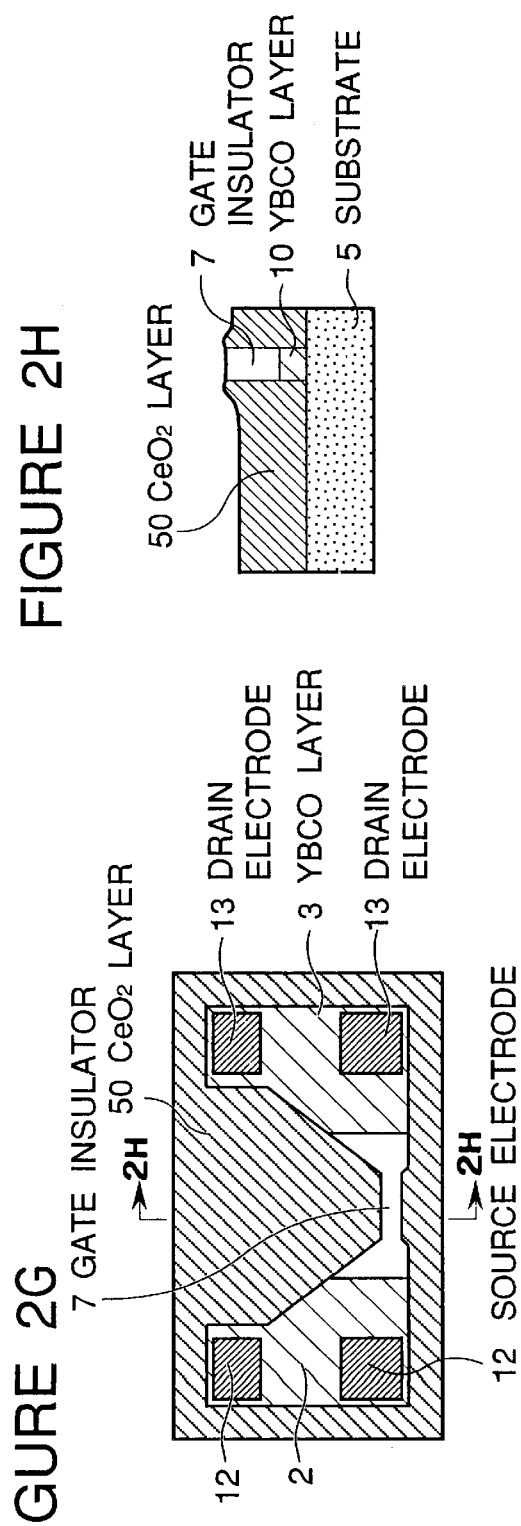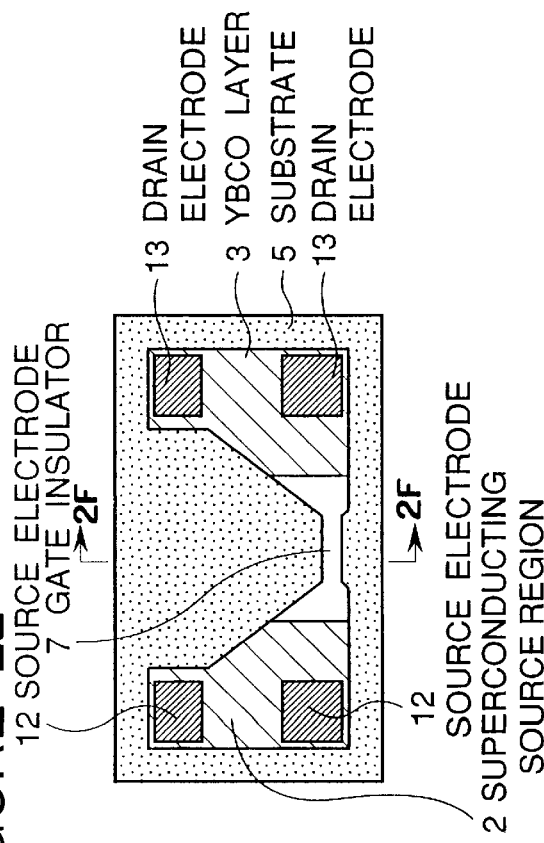

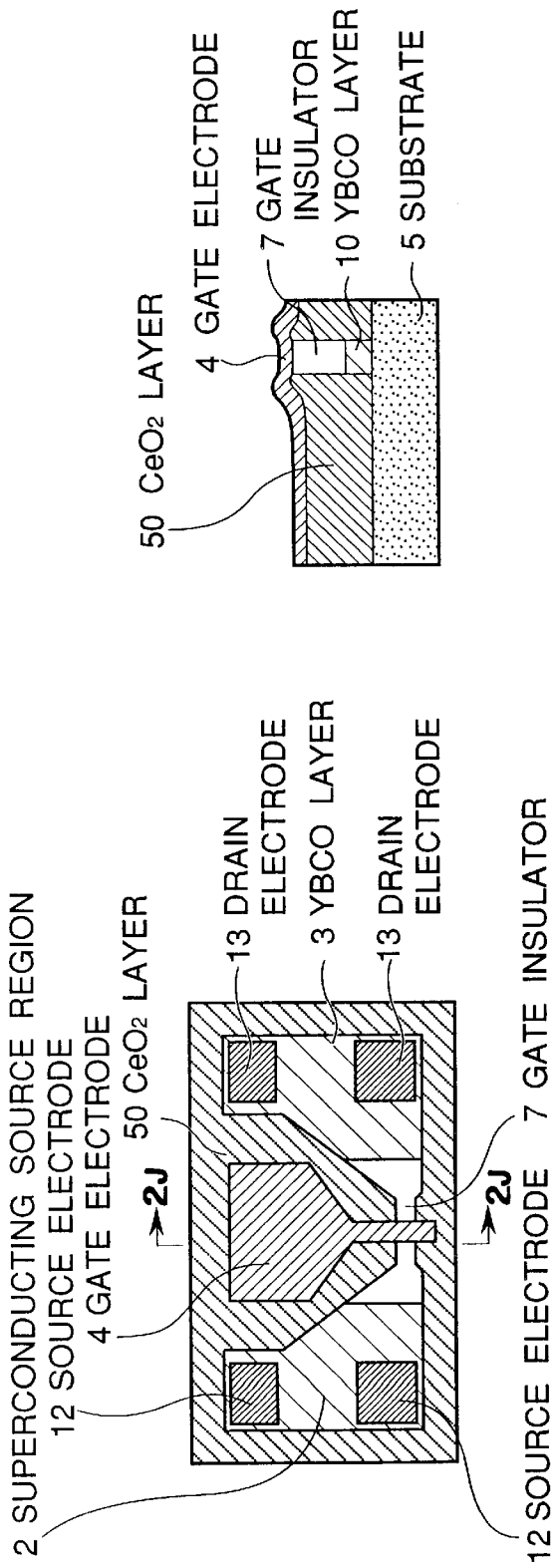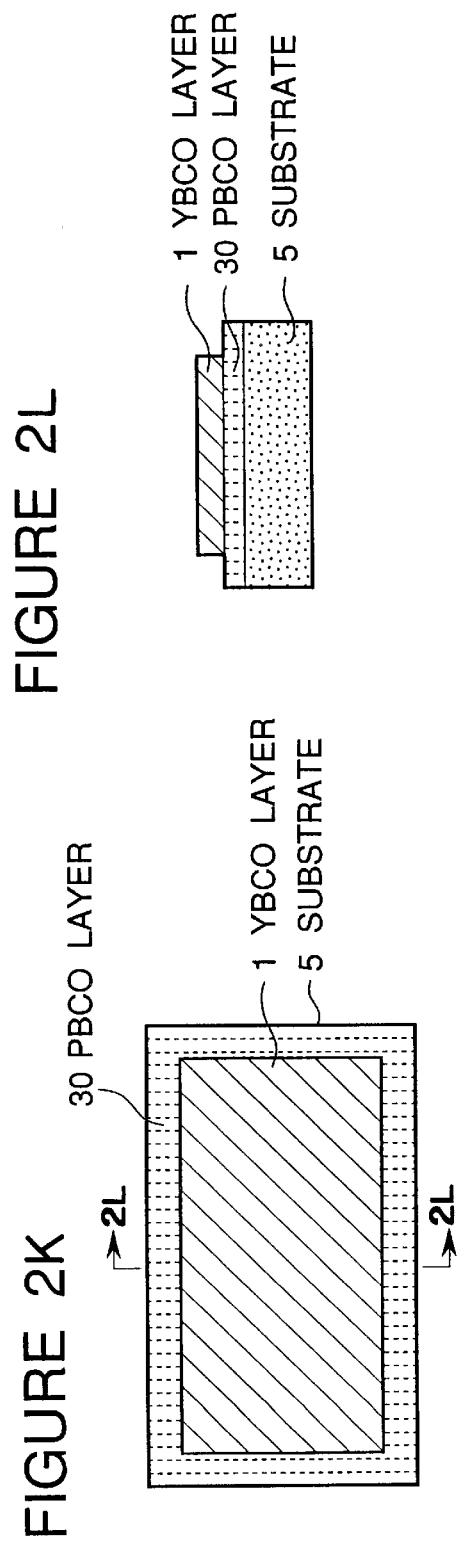

SUPERCONDUCTING DEVICE INCLUDING AN ISOLATION LAYER

BACKGROUND OF THE INVENTION

1. Field of the Invention

The present invention relates to a superconducting field effect device and method for manufacturing it. More specifically the present invention relates to a field effect transistor type superconducting device comprising a superconducting channel of oxide superconductor.

2. Description of Related Art

Devices which utilize superconducting phenomena operate rapidly with low power consumption so that they have higher performance than conventional semiconductor devices. Particularly, by using an oxide superconductor material which has been recently advanced in study, it is possible to produce a superconducting device which operates at relatively high temperature.

One of the most important three-terminal superconducting devices is a field effect transistor type superconducting device (abbreviated as super-FET hereinafter) having a channel of a superconductor formed between a source and a drain. In this superconducting device, a current flowing through the superconducting channel is controlled by a signal voltage applied to a gate formed above the superconducting channel.

The super-FET mentioned above is a voltage controlled device which is capable of isolating output signals from input ones and of having a well defined gain. In addition, it has a large current capability.

Referring to FIGS. 1A to 1D and 1AA to 1DD, a conventional process for manufacturing a conventional super-FET utilizing an oxide superconductor will be explained. The process is adaptation of a patterning method disclosed in Applied Physics Letters, vol. 57, No. 23, Dec. 3, 1990, pp. 2504–2506 and Japanese Journal of Applied Physics, vol. 29, No. 6, Jun. 6, 1990, pp.1076–1079. FIGS. 1A to 1D are plane views for illustrating the conventional process for manufacturing the conventional super-FET and FIGS. 1AA to 1DD are diagrammatic sectional views respectively taken on arrows of FIGS. 1A to 1D.

At first, a $SiO_2$ layer 20 is deposited on a substrate 5 such as a $SrTiO_3$ (100) substrate excluding a portion on which a superconducting region of the the super-FET will be disposed, as shown in FIGS. 1A and 1AA.

Then, a $Y_1Ba_2Cu_3O_{7-x}$ oxide superconductor film is deposited over the substrate 5. During the deposition process, silicon diffuses into the $Y_1Ba_2Cu_3O_{7-x}$ oxide superconductor film from the $SiO_2$ layer 20 so as to form a silicon-$Y_1Ba_2Cu_3O_{7-x}$ (abbreviated as Si—YBCO hereinafter) layer 21 on the $SiO_2$ layer 20. The Si—YBCO becomes an insulator due to reaction between $Y_1Ba_2Cu_3O_{7-x}$ and the diffused silicon. The Si—YBCO layer 21 isolates the super-FET from other elements and superconducting portions formed on the common substrate 5. A highly crystallized $Y_1Ba_2Cu_3O_{7-x}$ oxide superconductor film is grown on the exposed portion of the substrate 5 which provides a superconducting source region 2, a superconducting drain region 3 and a superconducting channel 10, as shown in FIGS. 1B and 1BB.

Thereafter, a gate insulator 7 of $SrTiO_3$, $BaTiO_3$ etc. is formed on the superconducting channel 10, as shown in FIGS. 1C and 1CC.

Finally, source electrodes 12, drain electrodes 13 and a gate electrode 4 of a noble metal such as Ag are respectively formed on the superconducting source region 2, superconducting drain region 3 and gate insulator 7 so that the super-FET is completed as shown in FIG. 1D and 1DD.

The oxide superconductor film is not directly etched in the above conventional process but is patterned by reaction between the oxide superconductor and silicon diffused from the $SiO_2$ layer. By this, the oxide superconductor film is not degraded by etching and process of forming and removing masks accompanied with etching.

However, most part of the gate insulator 7 is formed on the Si—YBCO layer 21 deposited on the $SiO_2$ layer 20 by the above conventional process. Due to low crystallinity of the Si—YBCO layer 21, the gate insulator 7 less crystallizes so that current leakage may occur between the gate electrode 4 and the superconducting channel 10.

In addition, since the oxide superconductor film is deposited at a step portion, grain boundaries are sometimes formed in the oxide superconductor film, which have adverse effect on the properties of the super-FET. Furthermore, the films may not grow to have sufficient thickness at the step portions, which caused various problems. In case of the gate insulator, the step portion of insufficient thickness contributes the current leakage.

On the other hand, according to the prior art, the oxide superconductor film is patterned by utilizing reaction between the oxide superconductor and silicon diffuses into the oxide superconductor film. Namely, a portion of the oxide superconductor film into which silicon diffuses from the $SiO_2$ layer underlying it is converted into a non-superconducting region. Therefore, diffusion of silicone in a lateral direction is unavoidable, which spoils accuracy of the patterning. Thus, fine patterning is limited in the above prior art.

Published European Patent Application No. 0 508 844 A discloses a method for patterning a YBCO film by utilizing silicon diffusion which is free from the step problem. In this method, a double-layer coating formed of a $MgAl_2O_4$ layer and a $BaTiO_3$ layer is formed on a portion of silicon substrate. A $SiO_2$ layer having a thickness equal to the double-layer coating is formed on another portion of the silicon substrate. A YBCO film is deposited over the double-layer coating and $SiO_2$ layer. Silicon diffuses from the $SiO_2$ layer into the YBCO film so as to convert it into a non-superconducting region. By this method, no step is formed on the substrate so that no grain boundary is formed in the YBCO film. However, problems accompanied with silicon diffusion still remain.

SUMMARY OF THE INVENTION

Accordingly, it is an object of the present invention to provide a super-FET having a novel configuration, which have overcome the above mentioned defects of the conventional ones.

Another object of the present invention to provide a method for manufacturing the above novel super-FET.

The above and other objects of the present invention are achieved in accordance with the present invention by a superconducting device;

comprising:

a substrate having a principal surface;

a thin superconducting channel formed of an oxide superconductor layer over the principal surface of the substrate;

a superconducting source region and a superconducting drain region formed of an oxide superconductor layer over the principal surface of the substrate at the both ends of the superconducting channel which connects the superconducting source region and the superconducting drain region, so that superconducting current can flow through the superconducting channel between the superconducting source region and the superconducting drain region; and a gate electrode on a gate insulator disposed on the superconducting channel for controlling the superconducting current flowing through the superconducting channel by a signal voltage applied to the gate electrode; wherein the superconducting device is isolated by a isolation layer directly formed on the principal surface of the substrate, the superconducting layer of the superconducting channel is directly formed on the principal surface of the substrate and the gate electrode is formed on the isolation layer excluding a portion on the gate insulator.

The oxide superconducting layer of the superconducting channel is formed directly on the principal surface of the substrate so that it is flat, highly crystallized and has no grain boundary in it. In addition, the gate insulator is formed on this flat and highly crystallized oxide superconductor layer so that it is also formed of an insulator layer of high crystallinity and an even thickness. Therefore, current leakage between the gate electrode and superconducting channel is completely prevented by the gate insulator.

In the super-FET according to the present invention, patterning of the oxide superconductor layer is conducted without utilizing silicone. Therefore, the oxide superconductor and the gate insulator deposited on it are not affected and degraded by diffusion of silicon.

In a preferred embodiment, the superconducting source region and superconducting drain region are formed of high-$T_c$ (high critical temperature) oxide superconductor, particularly, formed of high-$T_c$ copper-oxide type compound oxide superconductor for example a Y—Ba—Cu—O compound oxide superconductor material, a Bi—Sr—Ca—Cu—O compound oxide superconductor material, and a Tl—Ba—Ca—Cu—O compound oxide superconductor material.

In addition, the substrate can be formed of an insulating substrate, preferably an oxide single crystalline substrate such as MgO (100), $SrTiO_3$, YSZ, etc. It is also preferable that a surface of a $SrTiO_3$ substrate is processed by buffer solution of hydrofluoric acid. These substrate materials are very effective in forming or growing a crystalline film having a well defined crystalline orientation.

However, in one preferred embodiment, the super-FET can be formed on a substrate of a semiconductor material, if an appropriate insulating buffer layer is deposited thereon. For example, the buffer layer on the semiconductor substrate can be formed of a double-layer coating formed of a $MgAl_2O_4$ layer and a $BaTiO_3$ layer, a $CeO_2$ layer and a YSZ layer if silicon is used as a substrate.

The above and other objects, features and advantages of the present invention will be apparent from the following description of preferred embodiments of the invention with reference to the accompanying drawings.

BRIEF DESCRIPTION OF THE DRAWINGS

FIGS. 2A, 2C, 2E, 2G, and 2I are diagrammatic plane views for illustrating an embodiment of the process for manufacturing the super-FET in accordance with the present invention and FIGS. 2B, 2D, 2F, 2H, and 2I are diagrammatic sectional views respectively taken on arrows of FIGS. 2A, 2C, 2E, 2G, and 2I;

FIGS. 2K and 2L are a diagrammatic plane view and a diagrammatic sectional view taken on arrows of FIG. 2K illustrating another substrate used for the super-FET in accordance with the present invention.

DESCRIPTION OF THE PREFERRED EMBODIMENTS

Figure 1B:
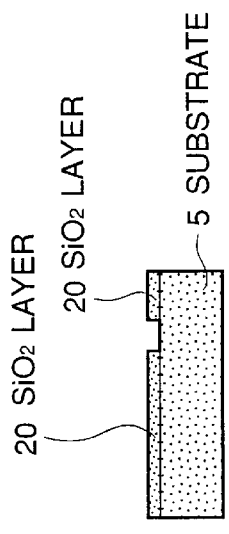
FIGS. 1B, 1D, 1F, and 1H are diagrammatic sectional views respectively taken on arrows of FIGS. 1A, 1C, 1E, and 1G.
Figure 1A:
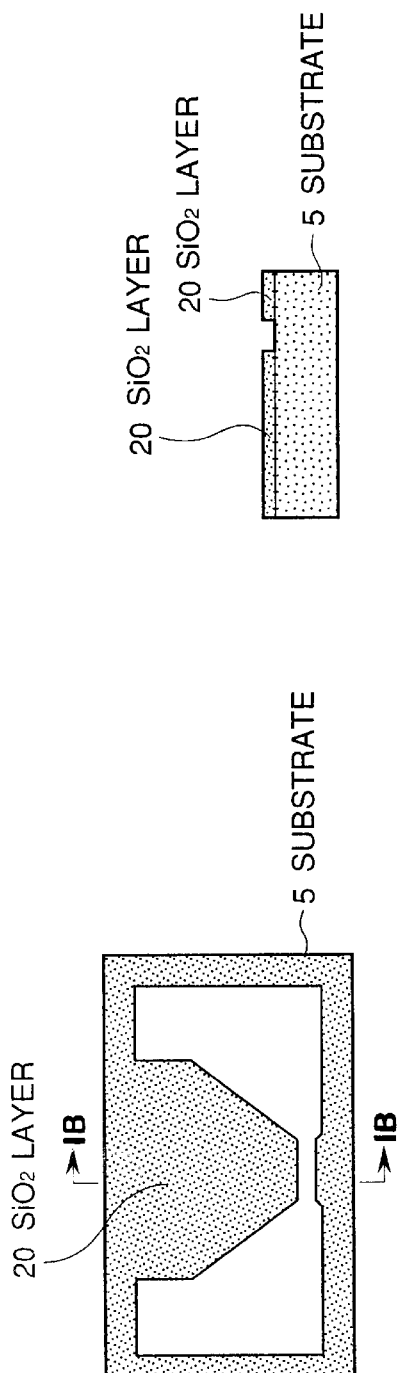
FIGS. 1A, 1C, 1E, and 1G are diagrammatic plane views for illustrating a conventional process for manufacturing a conventional super-FET
Figure 1D:
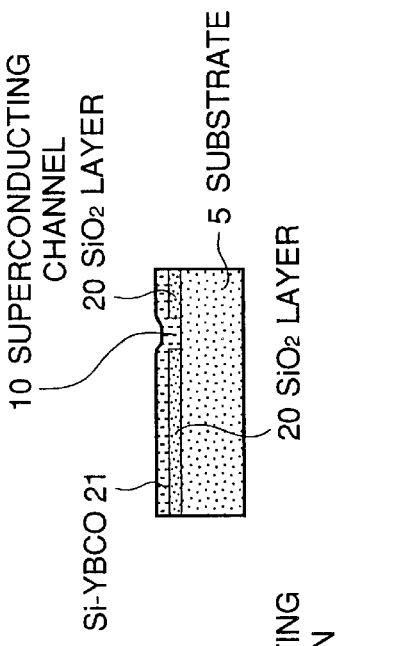
Figure 1C:
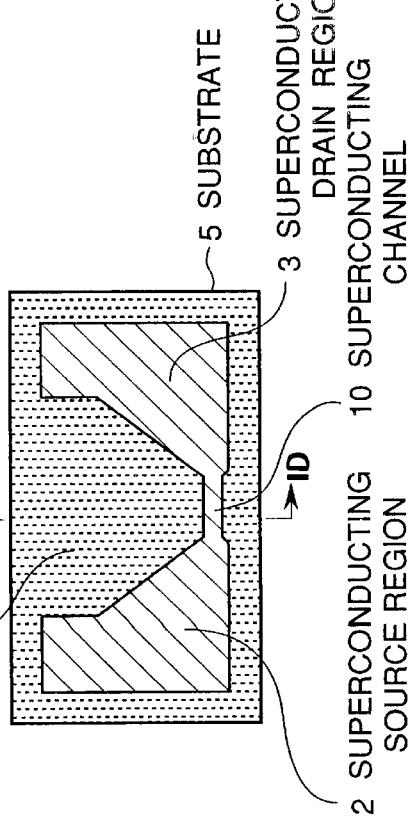
Figure 1F:
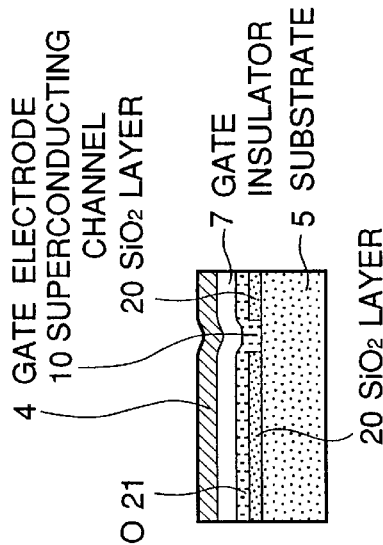
Figure 1H:
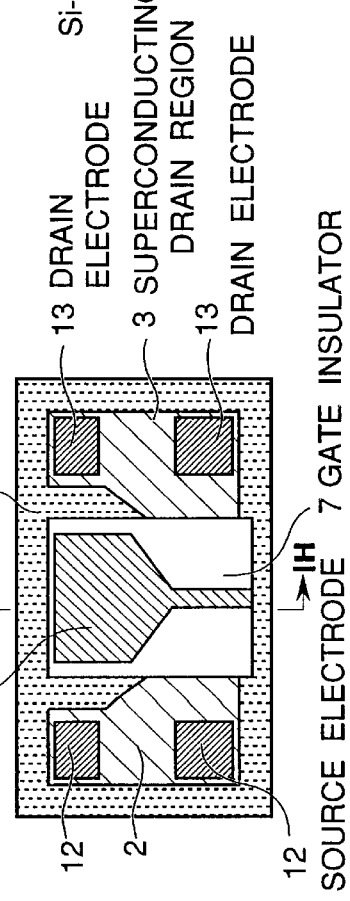
Figure 1E:
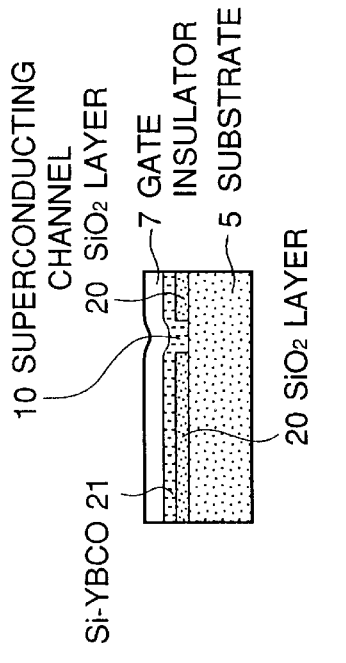
Figure 1G:
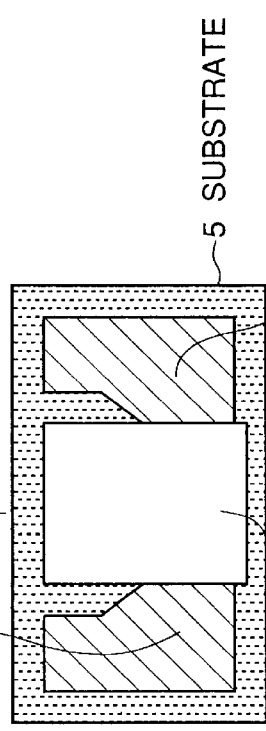

Referring to FIGS. 2A to 2L, a process for manufacturing the super-FET in accordance with the present invention will be described. FIGS. 2A, 2C, 2E, and 2G are plane views and FIGS. 2B, 2D, 2F, 2H, and 2I are diagrammatic sectional views respectively taken on arrows of FIGS. 2A, 2C, 2E, 2G and 2I.

On a $SrTiO_3$ (100) single crystalline substrate 5, a $Y_1Ba_2Cu_3O_{7-x}$ (abbreviated as YBCO hereinafter) oxide superconductor layer 1 was deposited by a reactive co-evaporation, as shown in FIGS. 2A and 2B. The YBCO layer 1 can also be deposited on a $SrTiO_3$ (100) single crystalline substrate 5 having a $Pr_1Ba_2Cu_3O_{7-y}$ (abbreviated as PBCO hereinafter) layer 30 on its surface, as shown in FIGS. 2K and 2L.

PBCO has a crystal structure equal to that of YBCO oxide superconductor and lattice parameters similar to those of YBCO oxide superconductor. The PBCO layer 30 prevents interdiffusion between the substrate and the YBCO oxide superconductor layer 1 and cancels inconsistencies of lattice parameters.

The substrate can be formed of an insulating substrate, preferably an oxide single crystalline substrate such as MgO, $SrTiO_3$, YSZ, etc. It is also preferable that a surface of a $SrTiO_3$ substrate is processed by buffer solution of hydrofluoric acid. These substrate materials are very effective in forming or growing a crystalline film having a well defined crystalline orientation.

It is also preferable to use a substrate of a semiconductor material, if an appropriate insulating buffer layer is deposited thereon. For example, the buffer layer on the semiconductor substrate can be formed of a double-layer coating formed of a $MgAl_2O_4$ layer and a $BaTiO_3$ layer, a $CeO_2$ layer and a YSZ layer if silicon is used as a substrate.

The YBCO layer 1 was formed of a $Y_1Ba_2Cu_3O_{7-x}$ oxide superconductor single crystal having a c-axis perpendicular to the substrate. The YBCO layer 1 may also be prepared by an MBE (Molecular Beam Epitaxy). A condition of forming the YBCO layer 1 by a reactive co-evaporation is as follows:

| | |
|---|---|
| Substrate temperature | 700° C. |
| Pressure | $3.999 \times 10^{-3}$ Pa ($3 \times 10^{-5}$ Torr) |
| (near the substrate; $O_2$ including 70 vol. % $O_3$ or more) | |
| Evaporation source and its crucible temperature | Y: 1220° C. |
| | Ba: 620° C. |
| | Cu: 1000° C. |
| Film thickness | 5 nanometers |

The YBCO layer 1 preferably has a thickness of 3 to 10 nanometers, which is favorable for a superconducting channel of the super-FET to obtain a complete ON/OFF operation by a signal voltage of a few volts applied to the gate electrode.

Thereafter, an insulator layer 17 of $SrTiO_3$ was deposited on a center portion of the YBCO layer 1 by utilizing a metal mask and a pair of source electrodes 12 and a pair of drain electrodes 13 were then formed of Ag by vacuum evaporation at the ends of the YBCO layer 1, as shown in FIGS. 2B and 2BB.

The insulator layer 17 will be a gate insulator which should have a thickness of 10 nanometers or more so as to prevent tunnel current. However, if the gate insulator has a too large thickness, higher signal voltages are required to modulate and control superconducting current flowing through the superconducting channel. Therefore, the insulator layer 17 should have a thickness of 4000 nanometers or less. A condition of forming the $SrTiO_3$ insulator layer 17 by a reactive co-evaporation is as follows:

| | |
|---|---|
| Substrate temperature | 500° C. |
| Pressure | $3.999 \times 10^{-3}$ Pa ($3 \times 10^{-5}$ Torr) |
| (near the substrate; $O_2$ including 70 vol. % $O_3$ or more) | |
| Evaporation source | Sr: 600° C. |
| and its crucible temperature | Ti: 1500° C. |
| Film thickness | 150 nanometers |

The insulator layer 17 can be formed of MgO, $Si_3N_4$, $Bi_4Ti_3O_{12}$, $Ba_xSr_{1-x}TiO_3$ ($0 \leq x \leq 1$), or PZT [$Pb(Zr, Ti)O_3$].

Thereafter, forming a photoresist mask, the YBCO layer 1 and the insulator layer 17 were etched by ion milling using Ar ions so that a superconducting source region 2, a superconducting drain region 3, a superconducting channel 10 and a gate insulator 7 were formed, as shown FIGS. 2C and 2CC. The superconducting channel 10 and the gate insulator 7 were formed to have a width of on the order of 5 $\mu$m.

Then, a $CeO_2$ layer 50 was deposited on an exposed portion of the substrate 5 by using laser deposition and lift-off process, as shown in FIGS. 2D and 2DD. The $CeO_2$ layer 50 was an isolation layer which electrically separated the super-FET from the other portions on the substrate 5. A condition of forming the $CeO_2$ layer 50 by laser deposition is as follows:

| | |
|---|---|
| Substrate temperature | Room Temperature |
| Pressure | 3.999 Pa ($3 \times 10^{-2}$ Torr; $O_2$) |
| Film thickness | 160 nanometers |

The isolation layer preferably has a thickness of 150 to 200 nanometers. The isolation layer should inhibit current leakage and additionally, it is preferable that it can be formed at a low temperature to prevent inter-diffusion of a layered structure of the super-FET.

For this purpose, the isolation layer can be formed of $CaF_2$, $SiO_2$ other than $CeO_2$, although $CeO_2$ is most preferable.

Finally, as shown in FIGS. 2E and 2EE, a gate electrode 4 of Ag having a thickness of 100 nanometers was formed over the gate insulator 7 and the $CeO_2$ layer 50 by vacuum evaporation so that the super-FET was completed.

In the above super-FET manufactured by the above method according to the present invention, there is no step or unevenness at a layered structure of the superconducting channel, gate insulator and gate electrode. Thus, it is free from a poor coating which causes current leakage between the gate electrode and superconducting channel. In addition, since a flat layered film is directly etched by utilizing photolithography technique, a fine processing of 1 $\mu$m or so can be repeatedly conducted. Furthermore, since interfaces of the layered structure of the superconducting channel, gate insulator and gate electrode are covered with the $CeO_2$ layer, electric field generated at the gate electrode is efficiently applied to the superconducting channel so as to increase the efficiency of modulation of superconducting current flowing through the superconducting channel. The $CeO_2$ layer also prevents current leakage between the gate electrode and superconducting channel since side surfaces of the gate insulator and superconducting channel are covered with the $CeO_2$ layer.

Figure 3:
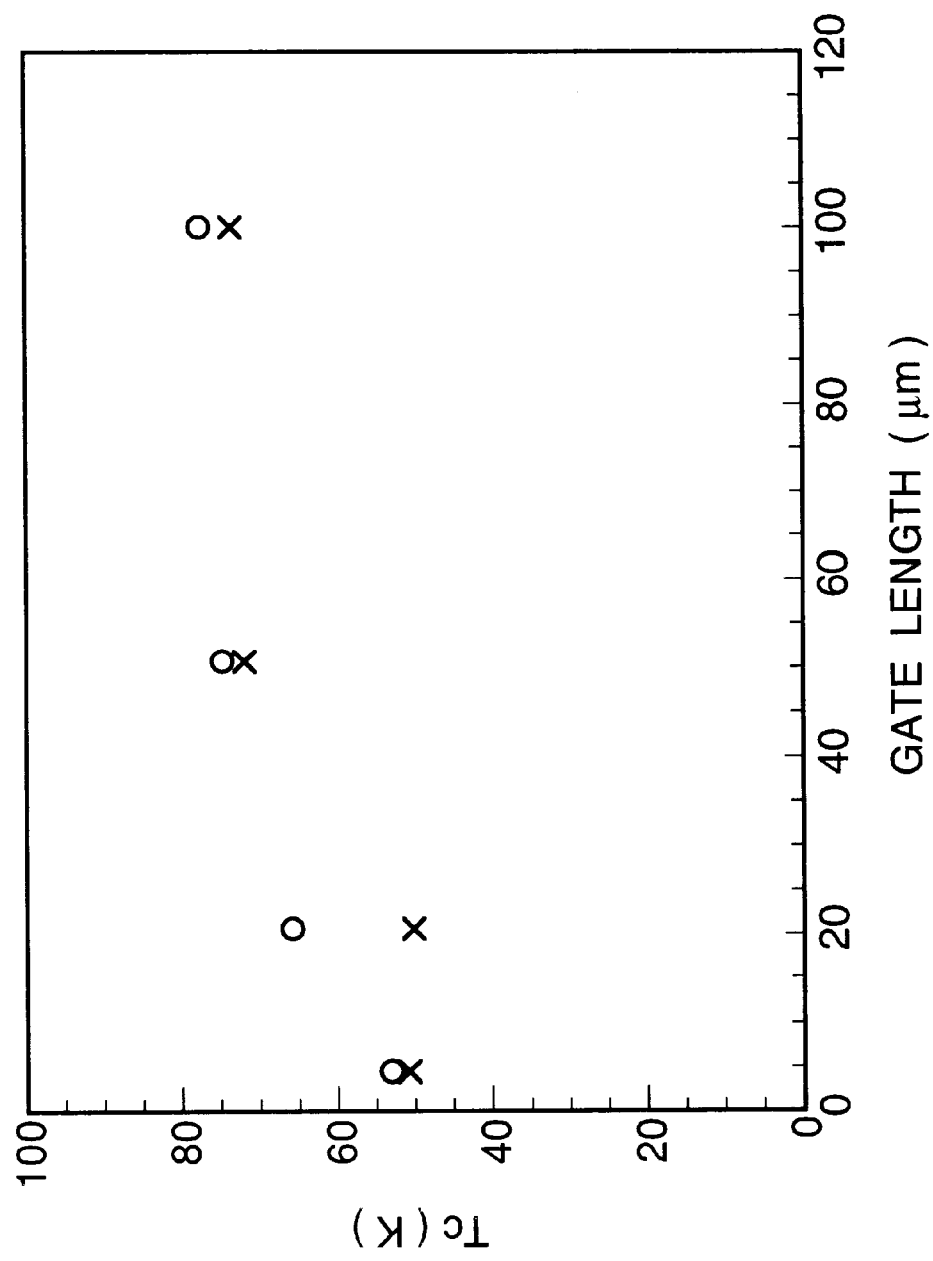
FIG. 3 is a graph illustrating relations between the gate lengths and the critical temperatures of the superconducting channels of the super-FETs in accordance with the present invention and conventional super-FETs.

FIG. 3 shows a graph illustrating relations between the gate lengths and the critical temperatures of the superconducting channels of the super-FETs in accordance with the present invention and conventional super-FETs. The gate length is a length of the superconducting channel along the direction of current just below the gate electrode. All the super-FETs had the superconducting channels of YBCO film having a thickness of 5 nanometers, the gate insulators of $SrTiO_3$ film having a thickness of 15 nanometers and the gate electrodes of Ag film having a thickness of 250 nanometers. The distance between the superconducting source and the superconducting drain was 100 $\mu$m, which was common to all the super-FETs.

The critical temperatures of the superconducting channels of the super-FETs in accordance with the present invention are indicated by circles and of the conventional super-FETs are indicated by crosses. As shown in FIG. 3, the critical temperatures of the superconducting channels of the super-FETs in accordance with the present invention were always higher than those of the conventional ones regardless of the length of the superconducting channel. This means that the layered structures of the super-FETs in accordance with the present invention were accurately processed without degrading the superconducting channels.

The properties of modulation of the super-FETs in accordance with the present invention and the conventional ones were measured. The conventional super-FETs had a degree of modulation of 1 percent, however the super-FETs in accordance with the present invention had a degree of modulation of 10 percent. The conventional super-FETs had a conductance of 2 milli-siemens/centimeter, however the super-FETs in accordance with the present invention had a conductance of 3 milli-siemens/centimeter.

As explained above, according to the present invention, a super-FET of novel configuration and a method for manufacturing it are provided. The super-FET of the present invention has a layered structure of the superconducting channel, gate insulator and gate electrode each of which is formed of a layer having high crystallinity and excellent properties. Thus, current leakage between the gate electrode and the superconducting channel is prevented so that the properties of the super-FET are improved as compared to the conventional one. In addition, by the method according to the present invention, the layered structure can be prepared with high accuracy, which facilitates to manufacture the super-FET of fine structure.

In the above mentioned embodiment, the oxide superconductor film can be formed of not only the Y—Ba—Cu—O compound oxide superconductor material, but also a high-$T_c$ (high critical temperature) oxide superconductor material, particularly a high-$T_c$ copper-oxide type compound oxide superconductor material, for example a Bi—Sr—Ca—Cu—O compound oxide superconductor material, and a Tl—Ba—Ca—Cu—O compound oxide superconductor material.

The invention has thus been shown and described with reference to the specific embodiments. However, it should be noted that the present invention is in no way limited to the details of the illustrated structures but converts and modifications may be made within the scope of the appended claims.

I claim:

1. A superconducting device; comprising:
    a substrate having a principal surface;
    a superconducting channel formed of an oxide superconductor layer over the principal surface of the substrate;
    a superconducting source region and a superconducting drain region formed of said oxide superconductor layer over the principal surface of the substrate at both ends of the superconducting channel which connects the superconducting source region and the superconducting drain region, so that superconducting current can flow through the superconducting channel between the superconducting source region and the superconducting drain region; and
    a gate electrode on a gate insulator disposed on the superconducting channel for controlling the superconducting current flowing through the superconducting channel by a signal voltage applied to the gate electrode; wherein the superconducting channel, superconducting source region and the superconducting drain region are formed of a single oxide superconductor film deposited on a flat plane and the superconducting device is isolated by an isolation layer directly formed on the principal surface of the substrate and which embeds the superconducting source region, the superconducting drain region, the superconducting channel and the gate insulator, so as to electrically isolate vertical side surfaces extending along the current flow direction, of the gate insulator and the superconducting channel and to prevent current from leaking between the gate electrode and the superconducting channel; the gate electrode being formed over the gate insulator and a portion of the isolation layer.

2. A superconducting device as claimed in claim 1; wherein the isolation layer has a thickness of 150 to 200 nanometers.

3. A superconducting device as claimed in claim 1; wherein the isolation layer is formed of $CeO_2$ layer, $CaF_2$ layer or $SiO_2$ layer.

4. A superconducting device as claimed in claim 1; wherein the superconducting channel has a thickness of 3 to 10 nanometers.

5. A superconducting device as claimed in claim 1; wherein the superconducting source region and superconducting drain region comprise high-$T_c$ (high critical temperature) oxide superconductor, particularly, formed of a high-$T_c$ copper-oxide type compound oxide superconductor.

6. A superconducting device as claimed in claim 5; wherein the oxide superconductors are formed of oxide superconductors material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material.

7. A superconducting device as claimed in claim 1; wherein the substrate is formed of a material selected from the group consisting of a MgO (100) substrate, a $SrTiO_3$ (100) substrate, a YSZ substrate and a semiconductor substrate having a insulating buffer layer on its surface.

8. A superconducting device as claimed in claim 7; wherein the substrate has a $Pr_1Ba_2Cu_3O_7$ layer on its surface.

9. A method for manufacturing a superconducting device as claimed in claim 1 comprising:
    a substrate having a principal surface;
    a thin superconducting channel formed of an oxide superconductor layer over the principal surface of the substrate;
    a superconducting source region and a superconducting drain region formed of said oxide superconductor layer over the principal surface of the substrate at both ends of the superconducting channel which connects the superconducting source region and the superconducting drain region, so that superconducting current can flow through the superconducting channel between the superconducting source region and the superconducting drain region; and
    a gate electrode on a gate insulator disposed on the superconducting channel for controlling the superconducting current flowing through the superconducting channel by a signal voltage applied to the gate electrode; wherein the superconducting device is isolated by an isolation layer directly formed on the principal surface of the substrate and around the superconducting source region, the superconducting drain region, the superconducting channel and the gate insulator, so as to electrically isolate side surfaces of the gate insulator and the superconducting channel and to prevent current from leaking between the gate electrode and the superconducting channel; the gate electrode being formed over the gate insulator and a portion of the isolation layer.

* * * * *